（12）United States Patent
Matsubara et al.

(10) Patent No.: US 7,173,331 B2
(45) Date of Patent: Feb. 6, 2007

(54) HERMETIC SEALING CAP AND METHOD OF MANUFACTURING THE SAME

(75) Inventors: Shigeji Matsubara, Hirakata (JP); Masaharu Yamamoto, Osaka (JP); Toshiaki Fukusako, Kagoshima (JP); Yoshito Tagashira, Izumi (JP)

(73) Assignee: Neomax Materials Co., Ltd., Osaka (JP)

( * ) Notice: Subject to any disclaimer, the term of this patent is extended or adjusted under 35 U.S.C. 154(b) by 175 days.

(21) Appl. No.: 10/926,102

(22) Filed: Aug. 26, 2004

(65) Prior Publication Data

US 2005/0023661 A1    Feb. 3, 2005

(51) Int. Cl.
*H01L 23/12* (2006.01)

(52) U.S. Cl. ............... 257/704; 257/710; 257/924; 257/E23.128; 257/E23.18; 257/E23.193; 257/E21.5; 257/E21.501

(58) Field of Classification Search ............... 257/704, 257/710, 924, E23.128, E23.18, E23.193, 257/E21.5, E21.501
See application file for complete search history.

(56) References Cited

U.S. PATENT DOCUMENTS

| | | | | |
|---|---|---|---|---|
| 5,578,869 | A * | 11/1996 | Hoffman et al. | 257/691 |
| 6,229,404 | B1 * | 5/2001 | Hatanaka | 331/68 |
| 6,489,558 | B1 * | 12/2002 | Baba et al. | 174/523 |
| 2003/0080411 | A1 * | 5/2003 | Baek et al. | 257/704 |

FOREIGN PATENT DOCUMENTS

| | | |
|---|---|---|
| JP | 55-46558 | 4/1980 |
| JP | 57-36846 | 2/1982 |
| JP | 57-96555 | 6/1982 |
| JP | 61-253836 | 11/1986 |
| JP | 63-122250 | 5/1988 |
| JP | 4-96256 | 3/1992 |
| JP | 5-275556 | 10/1993 |
| JP | 9-199622 | 7/1997 |
| JP | 09-199622 | 7/1997 |
| JP | 11-312758 | 11/1999 |
| JP | 2000-133734 | 5/2000 |
| JP | 2000-150687 | 5/2000 |

OTHER PUBLICATIONS

Chinese Office Action dated Sep. 8, 2006, issued in corresponding Chinese Patent Application No. 2004800000491.

* cited by examiner

*Primary Examiner*—Jasmine Clark
(74) *Attorney, Agent, or Firm*—Westerman, Hattori, Daniels & Adrian, LLP.

(57) ABSTRACT

A hermetic sealing cap member capable of suppressing deterioration of characteristics of an electronic component resulting from a sealant such as solder coming into contact with the electronic component in a package is obtained. This hermetic sealing cap, which is a hermetic sealing cap employed for an electronic component storing package for storing an electronic component (5, 34), comprises a hermetic sealing cap member (11, 41), a first plating layer (12, 42) formed at least on a region other than a region of the hermetic sealing cap member formed with a sealant (3, 32) and a second plating layer (13, 43), formed on the region of the hermetic sealing cap member on which the sealant is arranged, containing a material superior in wettability with the sealant to the first plating layer.

11 Claims, 7 Drawing Sheets

HERMETIC SEALING CAP AND METHOD OF MANUFACTURING THE SAME

TECHNICAL FIELD

The present invention relates to a hermetic sealing cap and a method of manufacturing the same, and more particularly, it relates to a hermetic sealing cap employed for an electronic component storing package for storing an electronic component and a method of manufacturing the same.

BACKGROUND TECHNIQUE

An electronic component storing package such as an SMD (Surface Mount Device) package (surface mount device package) employed for hermetically sealing an electronic component such as a SAW filter (surface acoustic wave filter) or a quartz resonator employed for removing noise from a portable telephone or the like is known in general. This electronic component storing package is disclosed in Japanese Patent Laid-Open No. 2000-150687, for example. A hermetic sealing cap is employed when hermetically sealing such an electronic component storing package.

FIG. 17 is a sectional view showing the overall structure of an electronic component storing package for storing an electronic component according to exemplary prior art. Referring to FIG. 17, an insulating ceramic frame body 102 is formed on an end face of an insulating ceramic substrate 101 to constitute a storage space in the electronic component according to the exemplary prior art. An electronic component 105 such as a quartz resonator is mounted onto the ceramic substrate 101 located in the storage space enclosed with the ceramic frame body 102 through bumps 104. A hermetic sealing cap member 111 is bonded onto the ceramic frame body 102 through a solder layer 103 serving as a sealant.

A nickel plating layer 112 is formed to cover the whole of the surfaces of the hermetic sealing cap member 111. A gold plating layer 113 is formed to cover the whole of the surfaces of the nickel plating layer 112. The gold plating layer 113 is provided in order to improve bondability to the solder layer 103 consisting of gold-tin solder, and the nickel plating layer 112 is provided as an undercoat layer for the gold plating layer 113.

A manufacturing process for a hermetic sealing package employed for the electronic component storing package shown in FIG. 17 is described with reference to FIGS. 18 and 19.

As shown in FIG. 18, the platelike hermetic sealing cap member 111 consisting of an iron-nickel-cobalt (Fe—Ni—Co) alloy is formed by press working. The nickel plating layer 112 is formed on the overall surfaces of the hermetic sealing cap member 111 as the undercoat layer, and the gold plating layer 113 is thereafter formed to cover the overall surfaces of the nickel plating layer 112.

As shown in FIG. 19, the solder layer 103 consisting of the gold-tin (Au—Sn) solder is temporarily brazed to portions of the surfaces of the gold plating layer 113 of the hermetic sealing cap member 111 bonded to the ceramic frame body 102. As shown in FIG. 17, the solder layer 103 temporarily brazed to the hermetic sealing cap member 111 is arranged to be in contact with the upper surface of the ceramic frame body 102 of the ceramic substrate 101 mounted with the electronic component 105 through the bumps 104. Thereafter the solder layer 103 is so melted as to bond the hermetic sealing cap member 111 to the upper surface of the ceramic frame body 102. Thus, the conventional electronic component storing package shown in FIG. 17 is formed.

In the conventional electronic component storing package shown in FIG. 17, however, there has been such an inconvenience that the number of components is increased since the substrate side is in the two-layer structure of the ceramic substrate 101 and the ceramic frame body 102.

In general, therefore, there is proposed an electronic component storing package according to another exemplary prior art forming a substrate side by a single layer while bringing a hermetic sealing cap into a structure having a cavity portion (recess portion) thereby reducing the number of components. FIG. 20 is a sectional view showing the electronic component storing package according to the other exemplary prior art. Referring to FIG. 20, the substrate side is constituted of a single-layer insulating ceramic substrate 131 in this electronic component storing package according to the other exemplary prior art. An electronic component 134 such as a quartz resonator is mounted onto a prescribed region of the ceramic substrate 131 through bumps 133. A hermetic sealing cap member 141 having a cavity portion (recess portion) is mounted through a solder layer 132 consisting of gold-tin (Au—Sn) solder, to seal the ceramic substrate 131. A nickel plating layer 142 serving as an undercoat layer is formed to cover the overall surfaces of the hermetic sealing cap member 141. A gold plating layer 143 is formed to cover the overall surfaces of the nickel plating layer 142.

As a manufacturing process for the electronic component storing package according to the other exemplary prior art shown in FIG. 20, a rough structure of the hermetic sealing cap member 141 having a flange portion 141a and the cavity portion (recess portion) 160 is formed in a first drawing step shown in FIG. 21. A second drawing step shown in FIG. 22 and a third drawing step shown in FIG. 23 are so carried out that the hermetic sealing cap member 141 including the flange portion 141a having a flat portion 141c shown in FIG. 23 is formed.

As shown in FIG. 24, the nickel plating layer 142 serving as the undercoat layer is formed to cover the overall surfaces of the hermetic sealing cap member 141. The gold plating layer 143 is formed to cover the overall surfaces of the nickel plating layer 142.

As shown in FIG. 25, the solder layer 132 consisting of the gold-tin solder is temporarily brazed onto the gold plating layer 143 corresponding to the flange portion 141a of the hermetic sealing cap member 141. As shown in FIG. 20, the solder layer 132 temporarily brazed to the hermetic sealing cap member 141 is arranged to be in contact with the upper surface of the ceramic substrate 131 mounted with the electronic component 134 through the bumps 133. Thereafter the solder layer 132 is so melted as to bond the hermetic sealing cap member 141 to the upper surface of the ceramic substrate 131. Thus, the electronic component storing package according to the other exemplary prior art shown in FIG. 20 is formed.

In the hermetic sealing cap employed for the electronic component storing package according to the exemplary prior art shown in FIG. 17 and the hermetic sealing cap employed for the electronic component storing package according to the other exemplary prior art shown in FIG. 20, however, there have been problems shown in FIGS. 26 and 27 respectively.

In the hermetic sealing cap member 111 according to the exemplary prior art shown in FIG. 17, the gold plating layer 113 is formed on the overall surfaces of the hermetic sealing cap member 111 through the nickel plating layer 112 serving as the undercoat layer. This gold plating layer 113 is so excellent in wettability with the solder layer 103 consisting of the gold-tin solder that the solder layer 103 disadvantageously flows into the side where the electronic component 105 is stored as shown in FIG. 26. When the solder layer 103 has thus flowed into the inner side, the influent solder layer 103 may have so scattered toward the electronic component 105 that the electronic component 105 and the solder layer 103 have come into contact with each other. There has been such a problem that device characteristics of the electronic component 105 are deteriorated in this case.

Also in the hermetic sealing cap member 141 having the cavity portion according to the other exemplary prior art shown in FIG. 20, the gold plating layer 143 is formed on the overall surfaces through the nickel plating layer 142 serving as the undercoat layer, and hence the solder layer 132 creeps up to the inner surface of the hermetic sealing cap member 141 when sealing the hermetic sealing cap member 141 to the ceramic substrate 131 with the solder layer 132, as shown in FIG. 27. When the solder layer 132 has thus crept up to the inner surface of the hermetic sealing cap member 141, the creeping solder layer 132 may have so scattered toward the electronic component 134 that the solder layer 132 and the electronic component 134 have come into contact with each other. There has been such a problem that device characteristics of the electronic component 134 are reduced in this case.

In the hermetic sealing cap member 141 having the cavity portion according to the other exemplary prior art shown in FIG. 20, further, the flange portion 141a is formed through the conventional general drawing steps shown in FIGS. 21 to 23 and hence a sealing side inner corner portion 141b of the flange portion 141a is brought into a rounded shape. In other words, there has been such a disadvantage that the radius of curvature of the sealing side inner corner portion 141b of the flange portion 141a is so increased that the length of the flat portion 141c of the flange portion 141a is reduced. If the length of the flat portion 141c of the flange portion 141a is reduced, there is such a problem that the length of a sealing surface is so reduced that sealing properties are deteriorated. In this case, further, there has been such a problem that the outside dimensions of the hermetic sealing cap member 141 are so increased that it is difficult to attain miniaturization as a result if an attempt is made to increase the length of the flat portion 141c of the flange portion 141a in order improve the sealing properties.

DISCLOSURE OF THE INVENTION

An object of the present invention is to provide a hermetic sealing cap capable of suppressing deterioration of characteristics of an electronic component resulting from a sealant such as solder coming into contact with the electronic component in a package.

Another object of the present invention is to provide a hermetic sealing cap capable of improving sealing properties and attaining miniaturization.

Still another object of the present invention is to provide a method of manufacturing a hermetic sealing cap capable of easily manufacturing a hermetic sealing cap capable of suppressing deterioration of characteristics of an electronic component resulting from a sealant coming into contact with the electronic component in a package.

A Further object of the present invention is to provide a method of manufacturing a hermetic sealing cap capable of easily manufacturing a hermetic sealing cap capable of improving sealing properties and attaining miniaturization.

A hermetic sealing cap according to a first aspect of the present invention, which is a hermetic sealing cap employed for an electronic component storing package for storing an electronic component, comprises a hermetic sealing cap member, a first plating layer formed at least on a region of the hermetic sealing cap member other than a region formed with a sealant and a second plating layer, formed on the region of the hermetic sealing cap member on which the sealant is arranged, containing a material superior in wettability with the sealant to the first plating layer.

In this hermetic sealing cap according to the first aspect, as hereinabove described, the first plating layer is provided at least on the region of the hermetic sealing cap member other than the region formed with the sealant while the second plating layer containing the material superior in wettability with the sealant to the first plating layer is provided on the region of the hermetic sealing cap member on which the sealant is arranged so that the sealant such as solder hardly flows into the side of the first plating layer, arranged on the region other than the region on which the sealant is arranged, inferior in wettability to the second plating layer when sealing the hermetic sealing cap with the sealant, whereby the sealant can be inhibited from flowing into the package. Thus, it is possible to suppress occurrence of such an inconvenience that the sealant flowing into the package comes into contact with the electronic component in the package. Consequently, deterioration of the characteristics of the electronic component resulting from the sealant flowing into the package can be suppressed. Further, the sealant is so inhibited from flowing out to a region other than a sealing surface that the quantity of the sealant can be reduced.

In the aforementioned hermetic sealing cap according to the first aspect, the electronic component storing package preferably includes a ceramic substrate and a ceramic frame body formed to constitute a storage space on a prescribed region of the surface of the ceramic substrate, and the hermetic sealing cap member is preferably mounted on the surface of the ceramic frame body through the sealant. According to this structure, the sealant can be easily inhibited from flowing into the package in the structure of the hermetic sealing cap member mounted on the ceramic frame body.

In the aforementioned hermetic sealing cap according to the first aspect, the hermetic sealing cap member preferably includes a recess portion and flange portions provided on both ends of the recess portion, and the radius of curvature of sealing side inner corner portions of the flange portions is preferably not more than 0.1 mm. According to this structure, the length of sealing surfaces (flat portions) of the flange portions is so increased that the sealing properties can be improved. When the flange portions including the sealing side inner corner portions having the small radius of curvature of not more than 0.1 mm according to the present invention are formed with the same length of the flat portions (sealing surfaces) as conventional flange portions of such a shape that sealing inner corner portions have a large radius of curvature, the internal volume of the recess portion can be rendered larger than the conventional one. Thus, the outside dimensions of the hermetic sealing cap member can be more reduced than the prior art when storing the same electronic component as the prior art, whereby miniaturization of the package can be attained.

In this case, the electronic component storing package includes a ceramic substrate, and the hermetic sealing cap member having the recess portion is mounted on the surface of the ceramic substrate through the sealant. According to this structure, the sealant can be easily inhibited from flowing into the package in the structure of the hermetic sealing cap member having the recess portion mounted on the ceramic substrate.

In the aforementioned hermetic sealing cap according to the first aspect, the first plating layer is preferably a nickel plating layer, and the second plating layer is preferably a gold plating layer. According to this structure, the sealant can be easily inhibited from flowing into the package due to the nickel plating layer inferior in wettability to the gold plating layer when sealing the hermetic sealing cap with the sealant.

In the aforementioned hermetic sealing cap according to the first aspect, the first plating layer may have a larger thickness than the second plating layer.

In the aforementioned hermetic sealing cap according to the first aspect, the sealant preferably includes gold-tin solder. According to this structure, the sealant excellent in wettability with the gold plating layer and inferior in wettability with the nickel plating layer can be easily obtained.

In the aforementioned hermetic sealing cap according to the first aspect, the hermetic sealing cap member may consist of an Fe—Ni—Co alloy.

A hermetic sealing cap according to a second aspect of the present invention, which is a hermetic sealing cap employed for an electronic component storing package for storing an electronic component, comprises a recess portion and flange portions provided on both ends of the recess portion, and the radius of curvature of sealing side inner corner portions of the flange portions is not more than 0.1 mm.

In this hermetic sealing cap according to the second aspect, as hereinabove described, the radius of curvature of the sealing side inner corner portions of the flange portions is so set to not more than 0.1 mm that the length of sealing surfaces (flat portions) of the flange portions is increased, whereby sealing properties can be improved. When the flange portions including the sealing side inner corner portions having the small radius of curvature of not more than 0.1 mm according to the present invention are formed with the same length of the flat portions (sealing surfaces) as conventional flange portions of such a shape that sealing inner corner portions have a large radius of curvature, the internal volume of the recess portion can be rendered larger than the conventional one. Thus, the outside dimensions of the hermetic sealing cap member can be more reduced than the prior art when storing the same electronic component as the prior art, whereby miniaturization of the package can be attained.

In this case, the hermetic sealing cap may consist of an Fe—Ni—Co alloy.

A method of manufacturing a hermetic sealing cap according to a third aspect of the present invention, which is a method of manufacturing a hermetic sealing cap employed for an electronic component storing package for storing an electronic component, comprises steps of forming a hermetic sealing cap member, forming a first plating layer and a second plating layer containing a material superior in wettability with a sealant to the first plating layer substantially on the overall surface of the hermetic sealing cap member and removing a portion of the second plating layer located on a region other than a region on which the sealant is arranged.

In this method of manufacturing a hermetic sealing cap according to the third aspect, as hereinabove described, the first plating layer and the second plating layer containing the material superior in wettability with the sealant to the first plating layer are formed substantially on the overall surface of the hermetic sealing cap member and the portion of the second plating layer located on the region other than the region on which the sealant is arranged is thereafter so removed that the second plating layer can be formed on the region of the hermetic sealing cap member on which the sealant is arranged while the first plating layer containing a material inferior in wettability with the sealant to the second plating layer can be formed on the region of the hermetic sealing cap member other than the region formed with the second plating layer. Thus, the sealant hardly flows into the side of the first plating layer inferior in wettability arranged on the region other than the region on which the sealant is arranged when sealing the hermetic sealing cap with the sealant, whereby the sealant can be inhibited from flowing into the package. Thus, it is possible to suppress occurrence of such an inconvenience that the sealant flowing into the package comes into contact with the electronic component in the package. Consequently, deterioration of the characteristics of the electronic component resulting from the sealant coming into contact with the electronic component in the package can be suppressed. Further, the sealant is so inhibited from flowing out to a region other than a sealing surface, whereby the quantity of the sealant can be reduced.

A method of manufacturing a hermetic sealing cap according to a fourth aspect of the present invention, which is a method of manufacturing a hermetic sealing cap employed for an electronic component storing package for storing an electronic component, comprises steps of forming a hermetic sealing cap member, forming a first plating layer substantially on the overall surface of the hermetic sealing cap member and forming a second plating layer containing a material superior in wettability with a sealant to the first plating layer on a region of the hermetic sealing cap member on which the sealant is arranged.

In this method of manufacturing a hermetic sealing cap according to the fourth aspect, as hereinabove described, the first plating layer is formed substantially on the overall surface of the hermetic sealing cap member and the second plating layer containing the material superior in wettability with the sealant to the first plating layer is thereafter formed on the region of the hermetic sealing cap member on which the sealant is arranged so that the second plating layer having excellent wettability can be formed on the region of the hermetic sealing cap member on which the sealant is arranged while the first plating layer containing a material inferior in wettability with the sealant to the second plating layer can be formed on the region of the hermetic sealing cap member other than the region formed with the second plating layer. Thus, the sealant hardly flows into the side of the first plating layer containing the material inferior in wettability arranged on the region other than the region on which the sealant is arranged when sealing the hermetic sealing cap with the sealant, whereby the sealant can be inhibited from flowing into the package. Thus, it is possible to suppress occurrence of such an inconvenience that the sealant flowing into the package comes into contact with the electronic component in the package. Consequently, deterioration of the characteristics of the electronic component resulting from the sealant coming into contact with the electronic component in the package can be suppressed. Further, the sealant is so inhibited from flowing out to a region other than a sealing surface, whereby the quantity of the sealant can be reduced.

In the aforementioned method of manufacturing a hermetic sealing cap according to the third or fourth aspect, the step of forming the hermetic sealing cap member preferably includes a first drawing step of forming a recess portion so that no flange portions are formed on the platelike hermetic sealing cap member and a second drawing step of coining both ends of the recess portion thereby forming the flange portions on both ends of the recess portion while setting the radius of curvature of sealing side inner corner portions of the flange portions to not more than 0.1 mm. According to this structure, the hermetic sealing cap member having the flange portions provided with sealing surfaces having a large length can be so formed that sealing properties can be improved. When the flange portions including the sealing side inner corner portions having the small radius of curvature of not more than 0.1 mm according to the present invention are formed with the same length of the flat portions (sealing surfaces) as conventional flange portions of such a shape that sealing inner corner portions have a large radius of curvature, the internal volume of the recess portion can be rendered larger than the conventional one. Thus, the outside dimensions of the hermetic sealing cap member can be more reduced than the prior art when storing the same electronic component as the prior art, whereby miniaturization of the package can be attained.

In the aforementioned method of manufacturing a hermetic sealing cap according to the third or fourth aspect, the first plating layer is preferably a nickel plating layer, and the second plating layer is preferably a gold plating layer. According to this structure, the sealant can be easily inhibited from flowing into the package when sealing the hermetic sealing cap with the sealant due to the nickel plating layer inferior in wettability to the gold plating layer.

In the aforementioned method of manufacturing a hermetic sealing cap according to the third or fourth aspect, the sealant preferably includes gold-tin solder. According to this structure, the sealant excellent in wettability with respect to the gold plating layer and inferior in wettability with respect to the nickel plating layer can be easily obtained.

In the aforementioned method of manufacturing a hermetic sealing cap according to the third or fourth aspect, the hermetic sealing cap member may consist of an Fe—Ni—Co alloy.

A method of manufacturing a hermetic sealing cap according to a fifth aspect of the present invention, which is a method of manufacturing a hermetic sealing cap employed for an electronic component storing package for storing an electronic component, comprises a first drawing step of forming a recess portion so that no flange portions are formed on a platelike hermetic sealing cap member and a second drawing step of coining both ends of the recess portion thereby forming the flange portions on both ends of the recess portion while setting the radius of curvature of sealing side inner corner portions of the flange portions to not more than 0.1 mm.

In this method manufacturing a hermetic sealing cap according to the fifth aspect, the aforementioned first and second drawing steps are so carried out that the hermetic sealing cap member having the flange portions provided with the sealing surfaces having a large length can be easily formed, whereby sealing properties can be improved. When the flange portions including the sealing side inner corner portions having the small radius of curvature of not more than 0.1 mm according to the present invention are formed with the same length of the flat portions (sealing surfaces) as conventional flange portions of such a shape that sealing inner corner portions have a large radius of curvature, the internal volume of the recess portion can be rendered larger than the conventional one. Thus, the outside dimensions of the hermetic sealing cap member can be more reduced than the prior art when storing the same electronic component as the prior art, whereby miniaturization of the package can be attained.

In the aforementioned method of manufacturing a hermetic sealing cap according to the fifth aspect, the hermetic sealing cap may consist of an Fe—Ni—Co alloy.

BEST MODES FOR CARRYING OUT THE INVENTION

Embodiments of the present invention are now described with reference to the drawings.

(First Embodiment)

Figure 1:
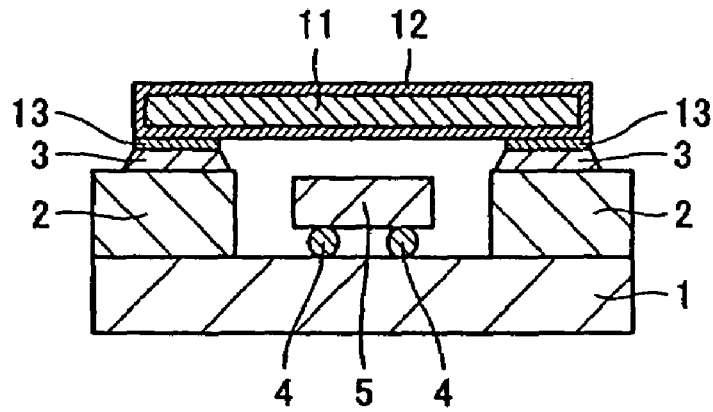
FIG. 1 is a sectional view showing the overall structure of an electronic component storing package according to a first embodiment of the present invention.

Referring to FIG. 1, a ceramic frame body 2 consisting of an insulating material such as alumina is formed to constitute a storage space on a prescribed region of the surface of a ceramic substrate 1 consisting of an insulating material such as alumina in this electronic component storing package according to a first embodiment. An electronic component 5 such as a quartz resonator is mounted on the ceramic substrate 1 located in the storage space enclosed with the ceramic frame body 2 through bumps 4. A hermetic sealing cap member 11 is bonded onto the ceramic frame body 2 through a solder layer 3 consisting of gold-tin solder (20Au—Sn solder, for example). This hermetic sealing cap member 11 consists of an Fe—Ni—Co (iron-nickel-cobalt) alloy.

According to the first embodiment, a nickel plating layer 12 is formed with a thickness of about 2 μm, to cover the overall surfaces of the hermetic sealing cap member 11. Further, a gold plating layer 13 having a thickness of about 0.05 μm is formed only on a region where the solder layer 3 is arranged in the surfaces of the nickel plating layer 12. The gold plating layer 13 is excellent in wettability with the solder layer 3 consisting of the gold-tin solder, while the nickel plating layer 12 is inferior in wettability with the solder layer 3 consisting of the gold-tin solder as compared with the gold plating layer 13. This nickel plating layer 12 is an example of the "first plating layer" in the present invention, and the gold plating layer 13 is an example of the "second plating layer" in the present invention. The solder layer 3 is an example of the "sealant" in the present invention. As another example of the first plating layer, there is nickel-phosphorus plating or the like. As another example of the second plating layer, there is gold-cobalt plating, gold-nickel plating or the like. As another example of the sealant, there is lead-free solder such as Sn—Ag, Sn—Cu, Sn—Ag—Cu or the like or Sn—Pb solder. Formation of the plating layers may be electroplating or electroless plating.

A manufacturing process for the electronic component storing package according to the first embodiment is now described with reference to FIGS. 1 to 4.

Figure 2:
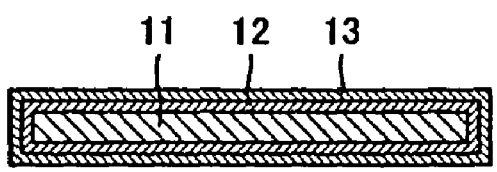
FIG. 2 is a sectional view for illustrating a manufacturing process for the electronic component storing package according to the first embodiment shown in FIG. 1.

As shown in FIG. 2, a platelike coil consisting of an iron-nickel-cobalt alloy is punched out by press working, thereby forming the hermetic sealing cap member 11 consisting of the iron-nickel-cobalt alloy. The nickel plating layer is formed on the overall surfaces of this hermetic sealing cap member 11 with the thickness of about 2 μm. The gold plating layer 13 having the thickness of about 0.05 μm is formed to cover the overall surfaces of the nickel plating layer 12.

Figure 3:
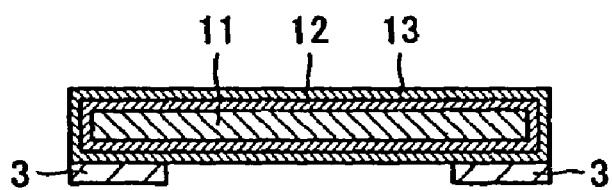
FIG. 3 is a sectional view for illustrating the manufacturing process for the electronic component storing package according to the first embodiment shown in FIG. 1.
Figure 4:
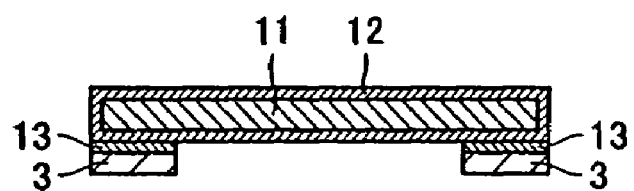
FIG. 4 is a sectional view for illustrating the manufacturing process for the electronic component storing package according to the first embodiment shown in FIG. 1.

As shown in FIG. 3, the solder layer 3 consisting of gold-tin solder (20Au—Sn solder, for example) is arranged on the prescribed region of the surfaces of the gold plating layer 13. Thereafter the solder layer 3 is temporarily brazed to the hermetic sealing cap member 11 at a temperature of at least about 280° C. Thereafter the solder layer 3 is employed as a mask for removing a portion of the gold plating layer 13 located on regions other than the region formed with the solder layer 3 with an Au release liquid. Thus, a shape shown in FIG. 4 is obtained. The hermetic sealing cap according to the first embodiment is obtained in this manner.

Thereafter the solder layer 3 temporarily brazed to the hermetic sealing cap member 11 is arranged to come into contact with the upper surface of the ceramic frame body 2 on the ceramic substrate 1 mounted with the electronic component 5 through the bumps 4, as shown in FIG. 1. Thereafter the solder layer 3 is melted at a temperature of at least about 280° C., thereby bonding the hermetic sealing cap member 11 to the upper surface of the ceramic frame body 2. Thus, the electronic component storing package according to the first embodiment shown in FIG. 1 is formed.

According to the first embodiment, as hereinabove described, the gold plating layer 13 excellent in wettability with the solder layer 3 is formed on the region of the hermetic sealing cap member 11 on which the solder layer 3 consisting of the gold-tin solder is arranged while the nickel plating layer 12 inferior in wettability with the solder layer 3 to the gold plating layer 13 is formed on the region other than the region on which the solder layer 3 is arranged to be exposed on the surface, whereby the solder layer 3 hardly flows into the side of the nickel plating layer 12 inferior in wettability to the gold plating layer 13 when sealing the hermetic sealing cap member 11 with the solder layer 3 consisting of the gold-tin solder. Thus, the solder layer 3 can be inhibited from flowing into the package, whereby occurrence of such an inconvenience that the solder layer 3 flowing into the package comes into contact with the electronic component 5 in the package can be suppressed. Consequently, deterioration of the characteristics of the electronic component 5 resulting from the solder layer 3 coming into contact with the electronic component 5 in the package can be suppressed.

According to the first embodiment, as hereinabove described, the solder layer 3 is inhibited from flowing out to a region other than a sealing surface, whereby the quantity of the solder layer 3 can be reduced.

(Second Embodiment)

Figure 5:
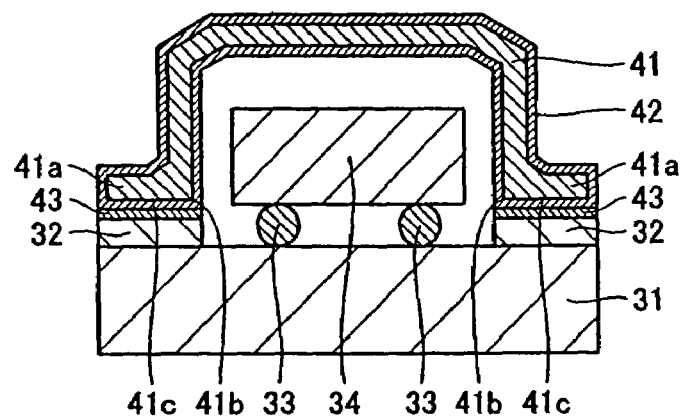
FIG. 5 is a sectional view showing the overall structure of an electronic component storing package according to a second embodiment of the present invention.

Referring to FIG. 5, an exemplary case of applying the present invention to a hermetic sealing cap having a cavity portion (recess portion) is described with reference to this second embodiment.

More specifically, a hermetic sealing cap member 41 having a cavity portion is bonded onto a ceramic substrate 31 consisting of an insulating material such as alumina through a solder layer 32 consisting of gold-tin solder (20Au—Sn solder, for example) in this electronic component storing package according to the second embodiment. An electronic component 34 such as a quartz resonator is mounted on the surface of the ceramic substrate 31 in the package through bumps 33.

According to the second embodiment, a nickel plating layer 42 having a thickness of about 2 μm is formed on the overall surfaces of the hermetic sealing cap member 41 having the cavity portion. Further, a gold plating layer 43 having a thickness of about 0.05 μm is formed on a region of the surfaces of the nickel plating layer 42 on which the solder layer 32 is arranged. The gold plating layer 43 is excellent in wettability with the solder layer 32 consisting of the gold-tin solder, while the nickel plating layer 42 is inferior in wettability with the solder layer 32 consisting of the gold-tin solder as compared with the gold plating layer 43. This nickel plating layer 42 is an example of the "first plating layer" in the present invention, and the gold plating layer 43 is an example of the "second plating layer" in the present invention. Further, the solder layer 32 is an example of the "sealant" in the present invention.

According to the second embodiment, sealing side inner corner portions 41b of flange portions 41a of the hermetic sealing cap member 41 are formed to have an extremely small radius of curvature larger than about 0 mm and not more than about 0.1 mm.

According to the second embodiment, as hereinabove described, the gold plating layer 43 is formed on the region of the hermetic sealing cap member 41 on which the solder layer 32 consisting of the gold-tin solder is arranged while the nickel plating layer 42 inferior in wettability with the solder layer 32 to the gold plating layer 43 is formed on the remaining region, whereby the solder layer 32 consisting of the gold-tin solder hardly flows into the side of the nickel plating layer 42 inferior in wettability when sealing the hermetic sealing cap member 41 with the solder layer 32 consisting of the gold-tin solder. Thus, the solder layer 32 can be inhibited from flowing into the package, whereby occurrence of such an inconvenience that the solder layer 32 flowing into the package comes into contact with the electronic component 34 in the package can be suppressed. Consequently, deterioration of characteristics of the electronic component 34 resulting from the solder layer 32 coming into contact with the electronic component 34 in the package can be suppressed.

According to the second embodiment, as hereinabove described, the solder layer 32 can be inhibited from flowing out to a region other than a sealing surface, whereby the quantity of the solder layer 32 can be reduced.

Figure 20:
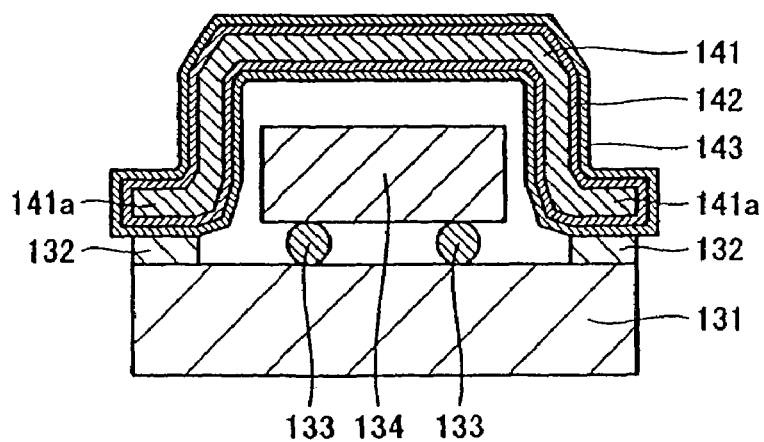
FIG. 20 is a sectional view showing the overall structure of an electronic component storing package according to another exemplary prior art.
Figure 21:
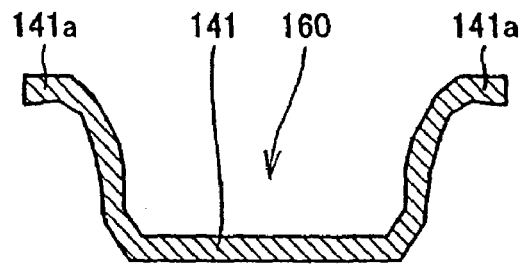
FIG. 21 is a sectional view for illustrating the manufacturing process for the electronic component storing package according to the other exemplary prior art shown in FIG. 20.
Figure 22:
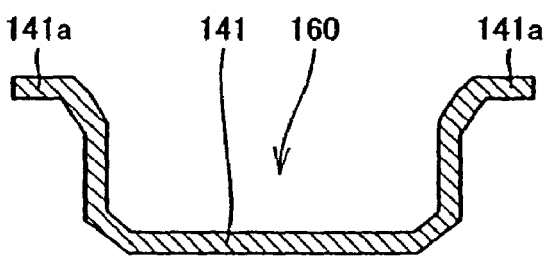
FIG. 22 is a sectional view for illustrating the manufacturing process for the electronic component storing package according to the other exemplary prior art shown in FIG. 20.

According to the second embodiment, the radius of curvature of the sealing side inner corner portions 41b of the flange portions 41a of the hermetic sealing cap member 41 is rendered larger than 0 mm and not more than about 0.1 mm so that the length of flat portions (sealing surfaces) 41c is larger as compared with the conventional structure shown in FIG. 20, whereby sealing properties can be improved.

An exemplary manufacturing process for the electronic component storing package according to the second embodiment is now described with reference to FIGS. 5 to 12.

Figure 6:
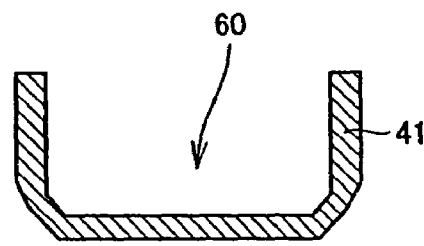
FIG. 6 is a sectional view for illustrating an exemplary manufacturing process for the electronic component storing package according to the second embodiment shown in FIG. 5.

As shown in FIG. 6, a platelike coil consisting of an iron-nickel-cobalt alloy constituting the hermetic sealing cap member 41 is press-worked as a first drawing step so that no flange portions are formed but the cavity portion (recess portion) 60 is formed.

Figure 7:
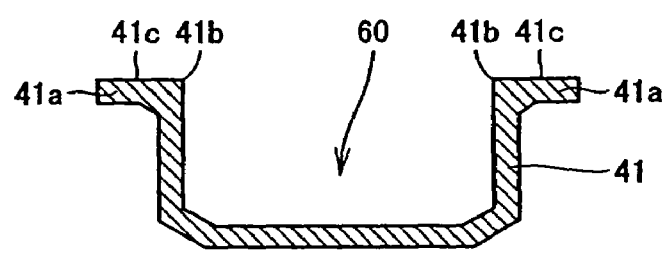
FIG. 7 is a sectional view for illustrating the exemplary manufacturing process for the electronic component storing package according to the second embodiment shown in FIG. 5.

As shown in FIG. 7, coining is performed as a second drawing step, thereby forming the flange portions 41a on both ends of the cavity portion 60. The sealing side inner corner portions 41b having the extremely small radius of curvature larger than 0 mm and not more than about 0.1 mm can be formed through the first drawing step show in FIG. 6 and the second drawing step shown in FIG. 7.

Figure 8:
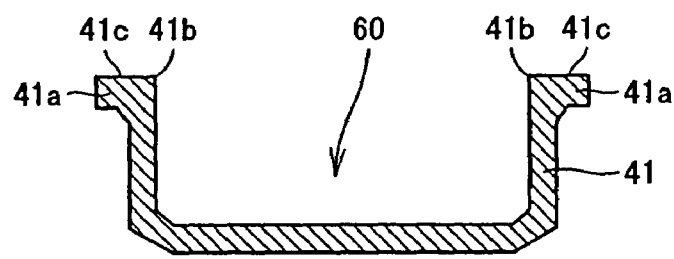
FIG. 8 is a sectional view for illustrating the exemplary manufacturing process for the electronic component storing package according to the second embodiment shown in FIG. 5.
Figure 23:
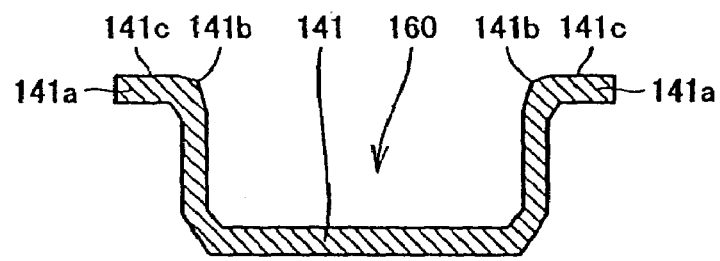
FIG. 23 is a sectional view for illustrating the manufacturing process for the electronic component storing package according to the other exemplary prior art shown in FIG. 20.
Figure 24:
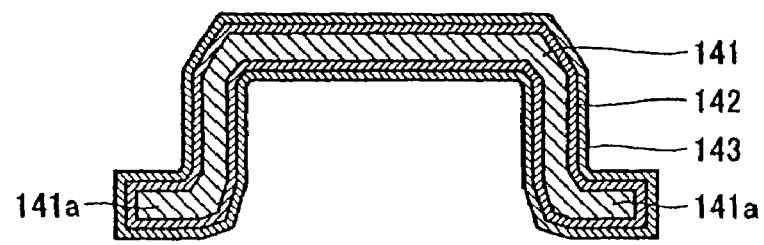
FIG. 24 is a sectional view for illustrating the manufacturing process for the electronic component storing package according to the other exemplary prior art shown in FIG. 20.
Figure 25:
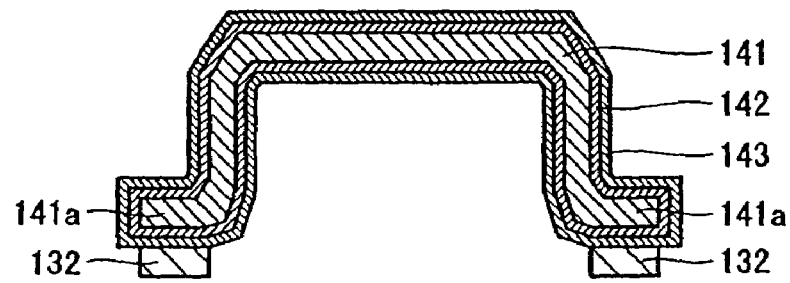
FIG. 25 is a sectional view for illustrating the manufacturing process for the electronic component storing package according to the other exemplary prior art shown in FIG. 20.
Figure 26:
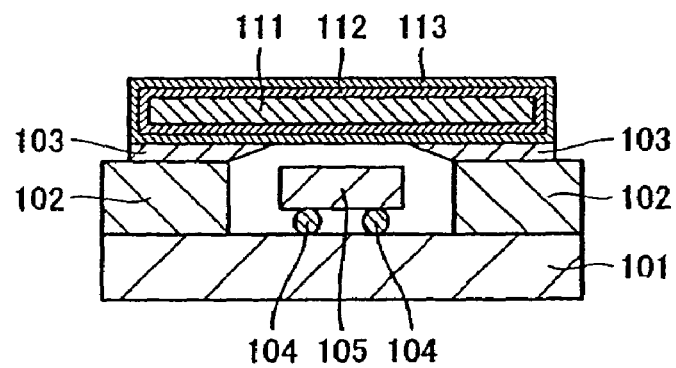
FIG. 26 is a sectional view for illustrating a problem in the electronic component storing package according to the exemplary prior art shown in FIG. 17.

The radius of curvature of the sealing side inner corner portions 41b is so extremely small as not more than about 0.1 mm that the length of the flat portions (sealing surfaces) 41c is larger as compared with the conventional structure, as hereinabove described. When the flat portions 41c of the flange portions 41a according to the second embodiment are formed with the length of the flat portions 41c identical to the length of the flat portions 141c of the conventional flange portions 141a shown in FIG. 23, for example, the internal volume of the cavity portion 60 is increased as shown in FIG. 8. When forming the hermetic sealing cap member 41 according to the second embodiment shown in FIG. 8 with the same outside dimensions as the conventional hermetic sealing cap member 141 having the cavity portion 160 shown in FIG. 23, therefore, the internal volume of the cavity portion 60 can be rendered larger than the internal volume of the cavity portion 160 shown in FIG. 23. When storing the same electronic component as the prior art, therefore, the hermetic sealing cap having small outer dimensions can be so employed that miniaturization of the package can be attained.

Figure 9:
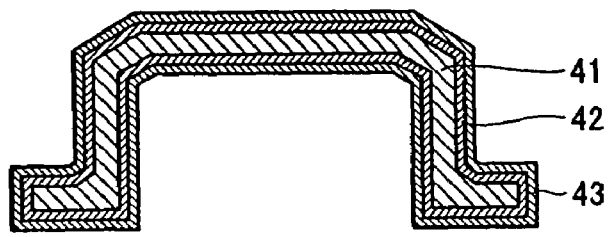
FIG. 9 is a sectional view for illustrating the exemplary manufacturing process for the electronic component storing package according to the second embodiment shown in FIG. 5.

After the second drawing step shown in FIG. 7, the nickel layer 42 is formed on the overall surfaces of the hermetic sealing cap member 41 with the thickness of about 2 μm and the gold plating layer 43 is thereafter formed with the thickness of about 0.05 μm, as shown in FIG. 9.

Figure 10:
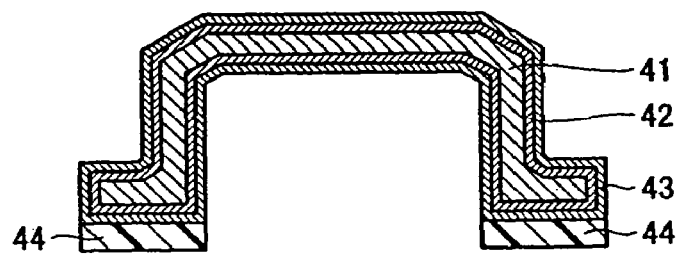
FIG. 10 is a sectional view for illustrating the exemplary manufacturing process for the electronic component storing package according to the second embodiment shown in FIG. 5.
Figure 11:
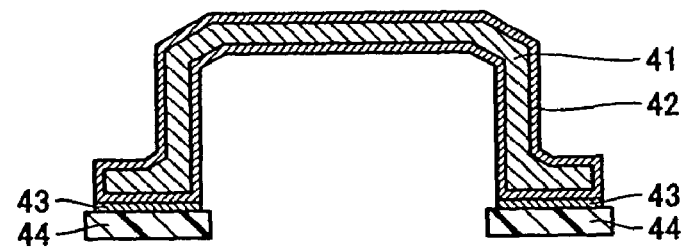
FIG. 11 is a sectional view for illustrating the exemplary manufacturing process for the electronic component storing package according to the second embodiment shown in FIG. 5.

As shown in FIG. 10, a resist film 44 is formed on the region of the gold plating layer 43 formed with the solder layer 32. The resist film 44 is employed as a mask for removing portions of the gold plating layer 43 other than the region on which the solder layer 32 is arranged with an Au release liquid. Thus, a shape shown in FIG. 11 is obtained. Thereafter the resist film 44 is removed.

Figure 12:
FIG. 12 is a sectional view for illustrating the exemplary manufacturing process for the electronic component storing package according to the second embodiment shown in FIG. 5.

As shown in FIG. 12, the solder layer 32 consisting of the gold-tin solder (Au—Sn solder, for example) is arranged on the gold plating layer 43, and the solder layer 32 is thereafter temporarily brazed to the gold plating layer 43 at a temperature of at least about 280° C.

Thereafter the solder layer 32 temporarily brazed to the gold plating layer 43 of the hermetic sealing cap member 41 is arranged to come into contact with the upper surface of the ceramic substrate 31 mounted with the electronic component 34 through the bumps 33, as shown in FIG. 5. Thereafter the solder layer 32 is melted at a temperature of at least about 280° C., thereby bonding the hermetic sealing cap member 41 to the upper surface of the ceramic substrate 31. Thus, the electronic component storing package according to the second embodiment shown in FIG. 5 is formed.

FIGS. 13 to 16 are sectional views for illustrating another exemplary manufacturing process for the electronic component storing package according to the second embodiment shown in FIG. 5. The other exemplary manufacturing process for the electronic component storing package according to the second embodiment is now described with reference to FIGS. 13 to 16.

Figure 13:
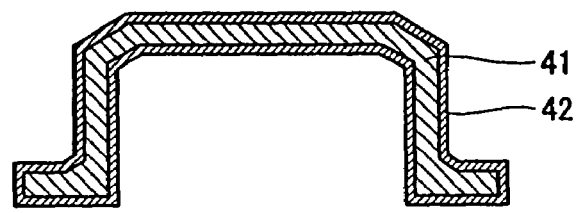
FIG. 13 is a sectional view for illustrating another exemplary manufacturing process for the electronic component storing package according to the second embodiment shown in FIG. 5.

First, the hermetic sealing cap member 41 having the shape shown in FIG. 7 is formed through the first drawing step and the second drawing step shown in FIGS. 6 and 7, and the nickel plating layer 42 having the thickness of about 2 μm is thereafter formed on the overall surfaces of the hermetic sealing cap member 41, as shown in FIG. 13.

Figure 14:
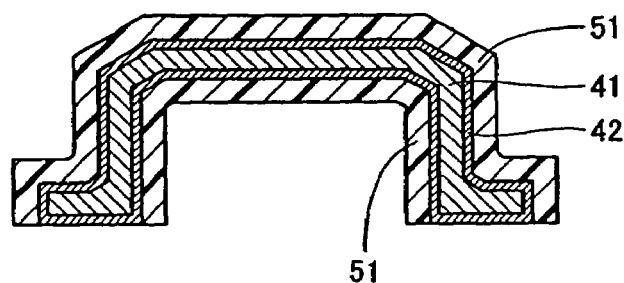
FIG. 14 is a sectional view for illustrating another exemplary manufacturing process for the electronic component storing package according to the second embodiment shown in FIG. 5.

As shown in FIG. 14, a resist film 51 is formed to cover the portion of the nickel plating layer 42 other than the region on which the solder layer 32 is arranged.

Figure 15:
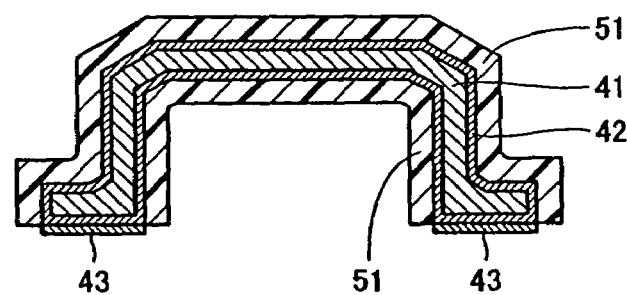
FIG. 15 is a sectional view for illustrating the other exemplary manufacturing process for the electronic component storing package according to the second embodiment shown in FIG. 5.
Figure 16:
FIG. 16 is a sectional view for illustrating the other exemplary manufacturing process for the electronic component storing package according to the second embodiment shown in FIG. 5.
Figure 17:
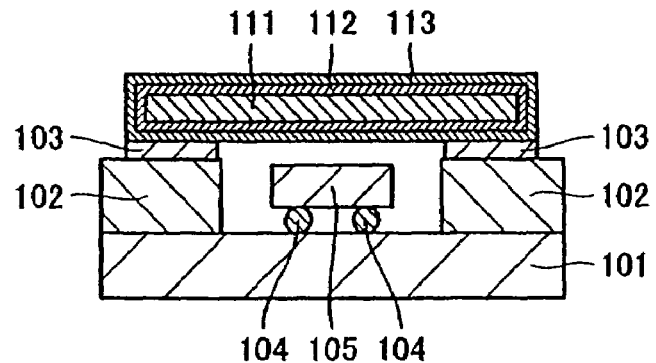
FIG. 17 is a sectional view showing the overall structure of an electronic component storing package according to exemplary prior art.
Figure 18:
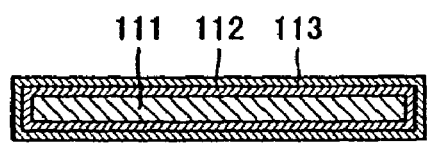
FIG. 18 is a sectional view for illustrating a manufacturing process for the electronic component storing package according to the exemplary prior art shown in FIG. 17.
Figure 19:
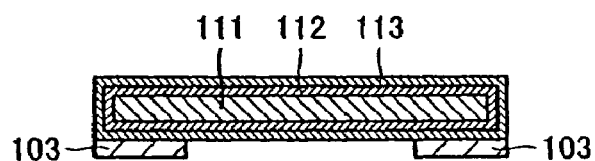
FIG. 19 is a sectional view for illustrating the manufacturing process for the electronic component storing package according to the exemplary prior art shown in FIG. 17.

As shown in FIG. 15, the gold plating layer 43 having the thickness of about 0.05 μm is formed on the region on which the solder layer 32 is arranged in the state forming the resist film 51. Thereafter the resist film 51 is so removed that a shape shown in FIG. 16 is obtained. Thereafter the solder layer 32 consisting of the gold-tin solder (20Au—Sn solder, for example) is arranged on the gold plating layer 43 and the solder layer 32 is thereafter temporarily brazed to the gold plating layer 43, similarly to the step shown in FIG. 12. Thereafter the hermetic sealing cap member 41 and the solder layer 32 are arranged to seal the ceramic substrate 31 as shown in FIG. 5, and the solder layer 32 is thereafter melted at a temperature of at least about 280° C. again, thereby performing hermetic sealing.

The embodiments disclosed this time must be considered as illustrative and not restrictive in all points. The scope of the present invention is shown not by the above description of the embodiments but by the scope of claim for patent, and all modifications within the meaning and range equivalent to the scope of claim for patent are included.

For example, while the solder layers consisting of the gold-tin (Au—Sn) solder have been employed as the sealants and the nickel plating layers and the gold plating layers have been employed as the plating layers in the aforementioned embodiments, the present invention is not restricted to this but a sealant consisting of another solder or brazing filler metal may be employed and other plating layers may be employed. In this case, effects similar to those of the aforementioned embodiments can be attained when providing a first plating layer at least on a region of a hermetic sealing cap member other than a region formed with a sealant while providing a second plating layer containing a material superior in wettability with the sealant to the first plating layer on the region of the hermetic sealing cap member on which the sealant is arranged.

Figure 27:
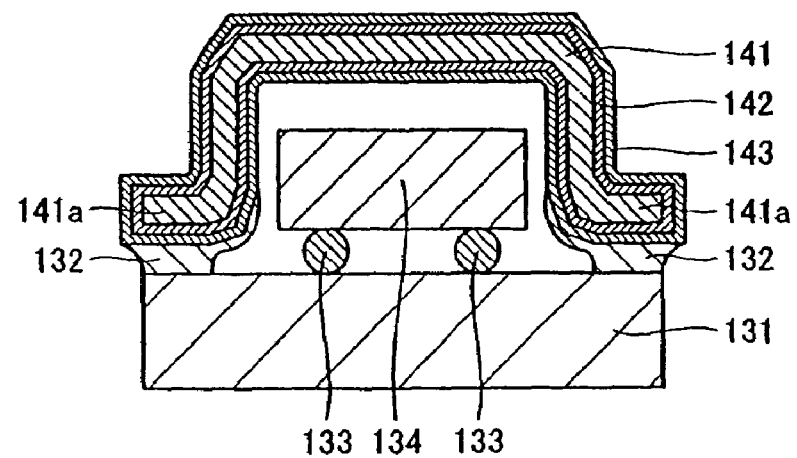
FIG. 27 is a sectional view for illustrating a problem in the electronic component storing package according to the other exemplary prior art shown in FIG. 20.

While the sealing side inner corner portions 41b are formed to have the radius of curvature larger than 0 mm and not more than 0.1 mm in the aforementioned embodiment, the present invention is not restricted to this but the sealing side inner corner portions 41b may alternatively be formed to be substantially right-angled (90°). Creeping of the conventional solder layer shown in FIG. 27 can be prevented by rendering the corner portions 41 substantially right-angled (90°). Thus, a miniature cap member having excellent sealing properties can be provided. In order to form the corner portions 41b to be substantially right-angled (90°), the sealing side inner corners of the flange portions may be formed by performing coining to crush the same in the second drawing step.

The invention claimed is:

1. A hermetic sealing cap employed for an electronic component storing package for storing an electronic component, comprising:
    a hermetic sealing cap member;
    a first plating layer formed at least on a region other than a region of said hermetic sealing cap member formed with a sealant; and
    a second plating layer, formed on the region of said hermetic sealing cap member on which the sealant is arranged, containing a material superior in wettability with said sealant to said first plating layer.

2. The hermetic sealing cap according to claim 1, wherein said electronic component storing package includes:
    a ceramic substrate, and
    a ceramic frame body formed to constitute a storage space on a prescribed region of the surface of said ceramic substrate, and
    said hermetic sealing cap member is mounted on the surface of said ceramic frame body through said sealant.

3. The hermetic sealing cap according to claim 1, wherein said hermetic sealing cap member includes:
    a recess portion, and
    flange portions provided on both ends of said recess portion, and
    the radius of curvature of sealing side inner corner portions of said flange portions is larger than 0 mm and not more than 0.1 mm.

4. The hermetic sealing cap according to claim 1, wherein said hermetic sealing cap member includes:
    a recess portion, and
    flange portions provided on both ends of said recess portion, and
    sealing side inner corner portions of said flange portions are substantially right-angled.

5. The hermetic sealing cap according to claim 3, wherein said electronic component storing package includes a ceramic substrate, and
    the hermetic sealing cap member having said recess portion is mounted on the surface of said ceramic substrate through said sealant.

6. The hermetic sealing cap according to any of claims 1 to 5, wherein
    said first plating layer is a nickel plating layer, and
    said second plating layer is a gold plating layer.

7. The hermetic sealing cap according to any of claims 1 to 5, wherein
    said first plating layer has a larger thickness than said second plating layer.

8. The hermetic sealing cap according to any of claims 1 to 5, wherein
    said sealant includes gold-tin solder.

9. The hermetic sealing cap according to any of claims 1 to 5, wherein
    said hermetic sealing cap member consists of an Fe—Ni—Co alloy.

10. A hermetic sealing cap employed for an electronic component storing package for storing an electronic component, comprising:
    a recess portion; and
    flange portions provided on both ends of said recess portion said flange portions having a flat surface to face a substrate, wherein the radius of curvature of sealing side inner corner portions of said flange portions is not more than 0.1 mm.

11. The hermetic sealing cap according to claim 10, wherein said hermetic sealing cap consists of an Fe—Ni—Co alloy.

* * * * *